(12) United States Patent
Brooks et al.

(10) Patent No.: US 7,691,683 B2
(45) Date of Patent: Apr. 6, 2010

(54) ELECTRODE STRUCTURES AND METHOD TO FORM ELECTRODE STRUCTURES THAT MINIMIZE ELECTRODE WORK FUNCTION VARIATION

(75) Inventors: Joseph F. Brooks, Nampa, ID (US); John T. Moore, Boise, ID (US)

(73) Assignee: Micron Technology, Inc.

( * ) Notice: Subject to any disclaimer, the term of this patent is extended or adjusted under 35 U.S.C. 154(b) by 79 days.

(21) Appl. No.: 11/368,455

(22) Filed: Mar. 7, 2006

(65) Prior Publication Data

US 2006/0148248 A1 Jul. 6, 2006

Related U.S. Application Data

(62) Division of application No. 10/725,500, filed on Dec. 3, 2003, now abandoned.

(51) Int. Cl.
*H01L 21/82* (2006.01)
(52) U.S. Cl. ............... 438/130; 438/652; 257/E21.585
(58) Field of Classification Search .......... 438/629, 438/631, 637, 644, 645, 648, 652, 654, 656, 438/627, 638, 687, 130, 625, 628, 642, 653; 257/748, 751–753, 758, 763, E21.585
See application file for complete search history.

(56) References Cited

U.S. PATENT DOCUMENTS

| | | | |
|---|---|---|---|
| 5,914,851 A | 6/1999 | Saenger et al. | |
| 6,479,900 B1 * | 11/2002 | Shinogi et al. | 257/758 |
| 6,734,559 B1 * | 5/2004 | Yang et al. | 257/751 |
| 7,074,709 B2 * | 7/2006 | Young | 438/625 |
| 7,166,532 B2 * | 1/2007 | Chun | 438/637 |

* cited by examiner

*Primary Examiner*—Quoc D Hoang
(74) *Attorney, Agent, or Firm*—Dickstein Shapiro LLP (57) ABSTRACT

Electrode structures, variable resistance memory devices, and methods of making the same, which minimize electrode work function variation. Methods of forming an electrode having a minimized work function variation include methods of eliminating concentric circles of material having different work functions. Exemplary electrodes include electrode structures having concentric circles of materials with different work functions, wherein this difference in workfunction has been minimized by recessing these materials within an opening in a dielectric and forming a third conductor, having a uniform work function, over said recessed materials.

34 Claims, 6 Drawing Sheets

ELECTRODE STRUCTURES AND METHOD TO FORM ELECTRODE STRUCTURES THAT MINIMIZE ELECTRODE WORK FUNCTION VARIATION

The present application is a divisional of application Ser. No. 10/725,500, filed Dec. 3, 2003 now abandoned, the entire disclosure of which is incorporated herein by reference.

FIELD OF THE INVENTION

The present invention relates to the field of random access memory (RAM) devices formed using a resistance variable material, and in particular to electrodes and method of forming electrodes used in resistance variable memory devices.

BACKGROUND OF THE INVENTION

Recently, resistance variable memory elements, which include Programmable Conductive Random Access Memory (PCRAM) elements and molecular memory elements, have been investigated for suitability as semi-volatile and non-volatile random access memory devices. A typical PCRAM device is disclosed in U.S. Pat. No. 6,348,365 assigned to Micron Technology, Inc., and hereby incorporated by reference. Typical molecular memory devices are described in U.S. Patent Application Publication No. 2002/0163831 to Krieger et al, which is hereby incorporated by reference. In typical PCRAM devices, conductive material, such as silver, is incorporated into a chalcogenide material, which is positioned between two electrodes. The unprogrammed PCRAM device is normally in a high resistance "on" state. A write operation programs the PCRAM device to a lower resistance "off" state via application of a threshold voltage potential between the two electrodes. Molecular memory devices function similarly, but utilize a molecular memory element such as a polymer, rather than a chalcogenide glass.

The programmed lower resistance state can remain intact for an indefinite period, typically ranging from hours to weeks, after the voltage potentials are removed. The PCRAM device can be returned to its higher resistance state by applying a reverse voltage potential of about the same order of magnitude as used to write the element to the lower resistance state. Again, the higher resistance state is maintained in a semi-volatile manner once the voltage potential is removed. In this way, such a device can function as a resistance variable memory element having two resistance states, which can be used as two logic states.

Formation of electrode structures for resistance variable memory cells often requires introducing adhesion and barrier layers between layers of conductive materials. Adhesion layers are useful for preventing two or more layers of conductive material from separating during processing of the memory device, while barrier layers can prevent the unwanted migration of metal ions through the memory cell during operation.

Figure 1A:
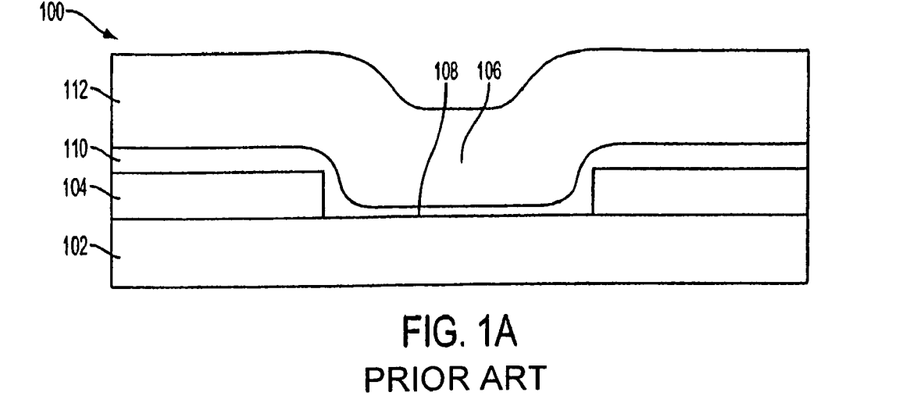
FIGS. 1A-D show an electrode structure in various stages of processing in accordance with the prior art.
Figure 1B:
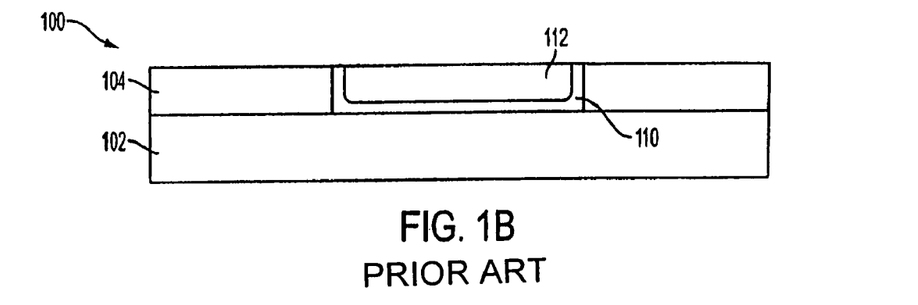

FIG. 1B shows an electrode structure 100, utilizing an adhesion/barrier layer 110 as described above. The introduction of such adhesion/barrier layers 110, however, may result in an upper electrode contact surface 103 being formed of multiple materials, as shown in FIG. 1B. By virtue of being formed of multiple materials, the upper electrode contact surface 103 exhibits multiple work functions. This variation in work function across the upper electrode contact surface 103 can have a detrimental effect on devices utilizing such electrode structures 100, particularly resistance variable devices. For example, when used in conjunction with an array of PCRAM devices described above, upper electrode contact surfaces 103 exhibiting multiple work functions can cause a variation in the threshold switching voltage of each PCRAM memory device, causing each device to switch from a high resistance state to a low resistance state at a different voltage. Such variation in threshold switching voltage makes writing and erasing a given memory device in the array unreliable. Thus, it would be desirable to form an electrode structure which minimizes electrode workfunction variation.

BRIEF SUMMARY OF THE INVENTION

In accordance with various exemplary embodiments of the present invention, electrode structures, variable resistance memory devices, and methods of making the same, which minimize electrode work function variation, are provided. In the various embodiments, an electrode having a minimal work function variation is provided by eliminating concentric circles of electrode materials having different work functions.

In accordance with a first embodiment of the invention, an electrode structure is made by forming a dielectric layer over a first conductive layer, forming an opening in the dielectric so as to expose a portion of the first conductive layer, forming an adhesion layer over the dielectric layer and the exposed portion of the first conductive layer, forming a second conductive layer over the adhesion layer, recessing the second conductive layer and the adhesion layer within the opening in the dielectric layer, and forming a third conductive layer over the dielectric layer and over the second conductive layer and the adhesion layer within the opening. This third conductive layer is planarized and recessed in the opening, thus presenting an electrode contact surface having a uniform work function.

In accordance with a second embodiment of the invention, an electrode structure is fabricated by forming a dielectric layer over a first conductive layer, forming an opening in the dielectric so as to expose a portion of the first conductive layer, forming an adhesion layer over the dielectric layer and the exposed portion of the first conductive layer, forming a second conductive layer over the adhesion layer, recessing the second conductive layer and the adhesion layer within the opening in the dielectric layer and forming a third conductive layer over the dielectric layer and the second conductive layer and the adhesion layer within the opening. The third conductive layer is subsequently patterned and etched.

In accordance with a third embodiment of the invention, the electrode structures of the first and second embodiments are coupled with a resistance variable memory element and another electrode to form a resistance variable memory device.

In accordance with a fourth embodiment of the present invention, a memory system is provided, wherein memory devices utilizing the electrode structures of the first and second embodiments are arranged in rows and columns such that each memory device can be selectively read, written, or erased.

BRIEF DESCRIPTION OF THE DRAWINGS

These and other features and advantages of the invention will be better understood from the following detailed description, which is provided in connection with the accompanying drawings.

DETAILED DESCRIPTION OF THE INVENTION

In the following detailed description, reference is made to various specific embodiments of the invention. These embodiments are described with sufficient detail to enable those skilled in the art to practice the invention, and it is to be understood that other embodiments may be employed, and that various structural, logical and electrical changes may be made without departing from the spirit or scope of the invention.

The present invention relates to electrode structures, variable resistance memory devices, and methods of making the same that minimize electrode workfunction variation. The workfunction of an electrode is a measure of the difficulty of escape of an electron from the electrode and is typically measured in electron volts. The lower the work function of the electrode, the greater the number of electrons that will be capable of escaping from the cathode when an electrical potential is applied thereto.

In the examples given below, the present invention is described as being used for electrode structures in resistance variable memory devices. It should be appreciated, however, that the teachings of the present invention can be used in conjunction with any device employing electrode structures.

Resistance variable memory devices typically employ an ionic conductor disposed between at least two electrodes. Ionic conductors include chalcogenide glasses having metal ions dissolved therein and molecular conductors, such as conductive polymers. The top and bottom electrodes may be formed from any conductive material, for example, tungsten, nickel, tantalum, aluminum, platinum, conductive nitrides, and other materials. Furthermore, the top and bottom electrodes may be formed from the same material or different materials and thus, the electrode work functions of the two electrodes may also be the same or different. It is critical to the performance of the memory device, however, that each of the top and bottom electrodes exhibit a uniform work function as described below.

FIGS. 1A-1D illustrate a conventional method of forming an electrode structure 100 for a resistance variable device. In FIG. 1A, a first layer 102 of conductive material is deposited or formed on a substrate (not shown). The first layer 102 may be any conductive material such as, for example, tungsten, nickel, tantalum, aluminum, platinum, conductive nitrides, and other materials. A dielectric layer 104 is deposited over the first conductive layer 102. The dielectric layer 104 may be a nitride, such as silicon nitride ($Si_3N_4$), or a similar dielectric material. Using conventional photolithographic techniques, an opening 106 is formed in the dielectric layer 104, to expose a portion of the surface 108 of the underlying first conductive layer 102. An adhesion layer 110 is formed over the dielectric layer 104 and the exposed surface 108 of the conductive layer 102. Typical adhesion layers include titanium nitride and may also include various oxide layers such as silicon oxide. The adhesion layer 110 may also act as a barrier layer, preventing the migration of metal ions from the first conductive layer 102 into other components of a device employing the electrode structure. A second layer 112 of conductive material is deposited over the adhesion/barrier layer 110. The second layer 112 of conductive material may be any suitable conductive material such as, for example, tungsten or titanium nitride.

The second layer 112 of conductive material is planarized such that a top surface of said conductive layer 112 is substantially level with a top surface of a said dielectric layer 104, as shown in FIG. 1B. The planarization of the electrode structure may be accomplished by a chemical mechanical planarization (CMP) process or the like. The adhesion layer 110 provides sufficient adhesion between the first and second conductive layers 102, 112 to prevent the layers 102, 112 from being separated by the forces generated during the CMP process.

Figure 2:
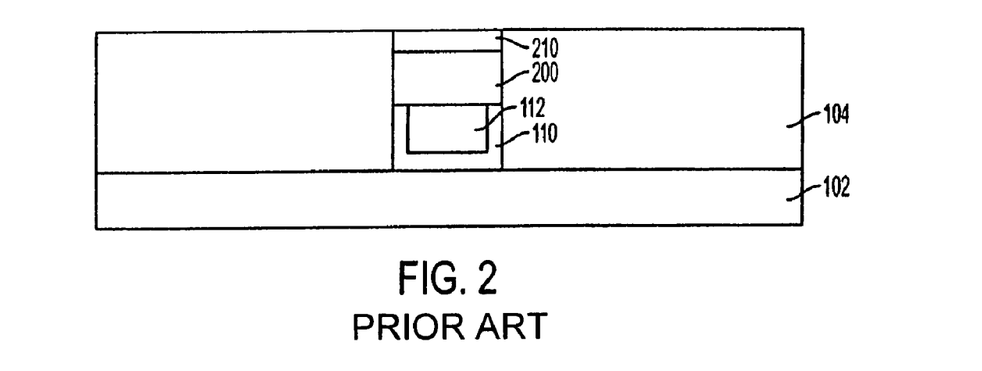
FIG. 2 shows a variable resistance memory device employing the electrode structure as shown in FIGS. 1A-D.

At this stage of processing, the electrode structure 100 may be used in conjunction with other elements to form various devices. For example, as shown in FIG. 2, a resistance variable memory element 200 and a top electrode 210 can be deposited over the electrode structure to form a resistance variable memory device. In this example, the second conductive layer 112 and the adhesion/barrier layer 110 essentially act as contacts between the first conductive layer 102 and the resistance variable memory element 200.

Figure 1C:
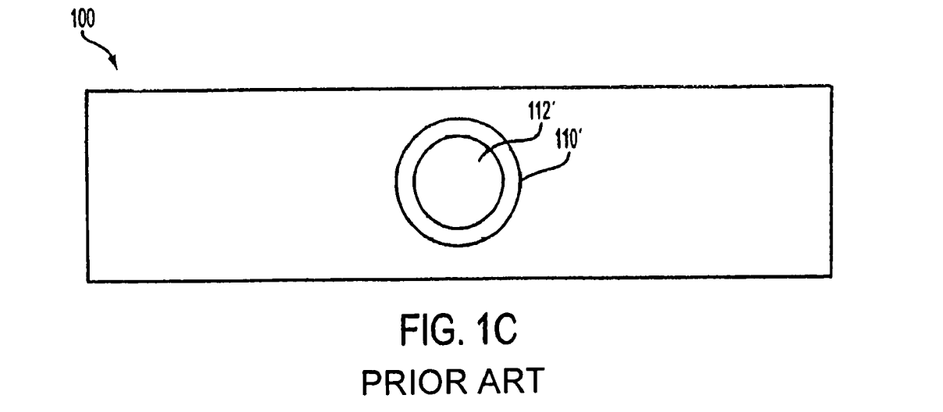
Figure 1D:
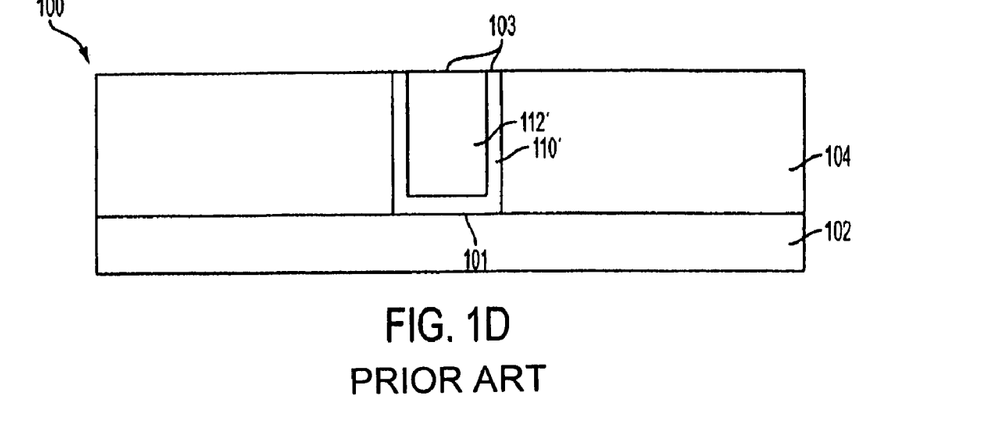

FIGS. 1C and 1D respectively show a top view and a cross section of the electrode structure 100. As can be seen in FIGS. 1C and 1D, the method of forming an electrode structure described above results in a structure having concentric rings 110', 112' of different materials, each ring 110', 112' having a different work function. The inner ring 112' is formed from the second conductive layer 112 and the outer ring 110' is formed from the barrier/adhesion layer 110. When such an electrode structure is used in conjunction with a resistance variable memory element as shown is FIG. 2, this work function variation has an adverse affect on memory device performance.

For example, the materials used for the second conductive layer 112 and the barrier/adhesion layer 110 may be different metal materials, each exhibiting different structural characteristics, such as grain size. Differences in grain size, for example, can lead to a variation in localized electric fields at the interface of the layers 110, 112 during device operation. Such variation in localized electric fields affects the magnitude of the threshold voltage required to switch the device and is not necessarily uniform from device to device. Thus, an array of PCRAM devices, for example, employing the electrode structure described above, may exhibit non-uniform threshold voltages from memory device to memory device. Such non-uniform threshold voltages seriously compromise the ability to reliably read, write, and erase any give memory device in the array.

Accordingly, the present invention provides electrode structures and their methods of formation, which eliminate the problem of having concentric circles of materials with different work functions.

In accordance with a first exemplary embodiment of the invention, an electrode structure and method of forming an electrode structure is provided, wherein the electrode structure has a second conductive layer having a uniform work function.

Figure 3:
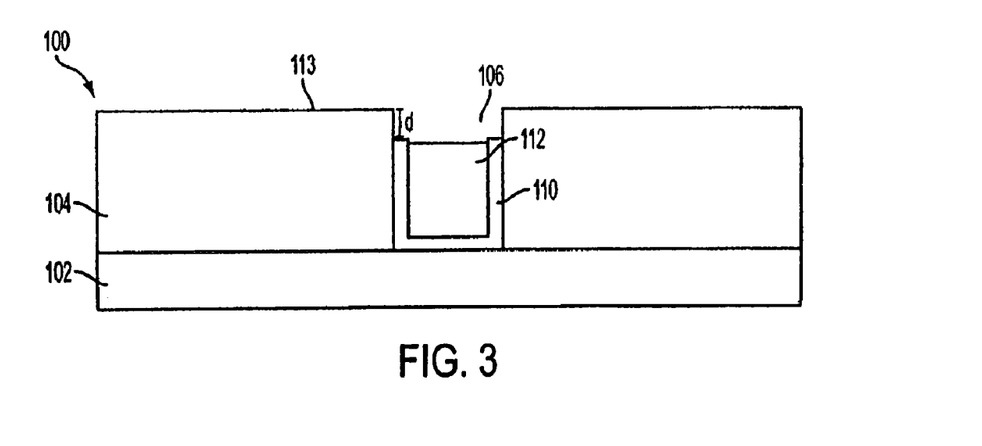
FIG. 3 shows an exemplary electrode structure in an intermediate stage of processing in accordance with an embodiment of the present invention.
Figure 4:
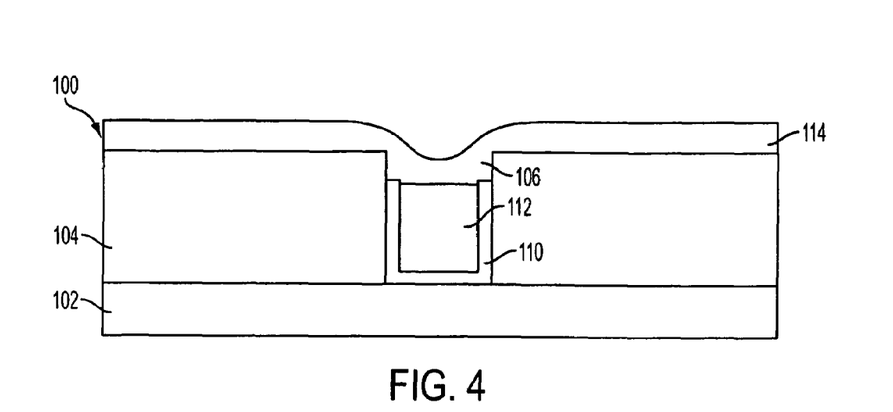
FIG. 4 shows an exemplary electrode structure in an intermediate stage of processing in accordance with an embodiment of the present invention.
Figure 5:
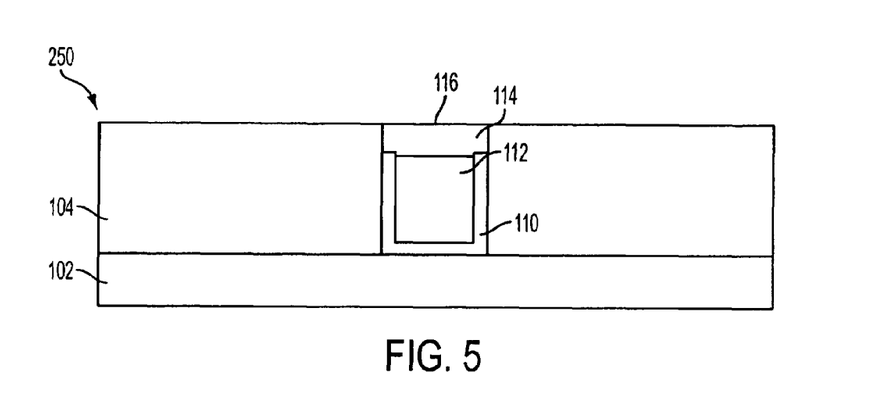
FIG. 5 shows an electrode structure in accordance with a first exemplary embodiment of the invention.

Referring now to FIG. 3, an electrode structure 100 is formed as described above in connection with FIGS. 1A-1D, resulting in an electrode structure 100 having concentric rings of different materials. As described above, desirable first conductive layers 102 may be formed from any suitable conductive material such as, for example, tungsten, nickel, tantalum, aluminum, platinum, conductive nitrides, and other conductive materials. Desirable second conductive layers 112 include tungsten, while desirable adhesion/barrier layers 110 include titanium nitride. The electrode structure 100 is etched using a conventional etching process such that the adhesion/barrier layer 110 and second conductive layer 112 are recessed with respect to a top surface 113 of the dielectric layer 104. A desirable recess depth d for the adhesion/barrier layer 110 and second conductive layer 112 is about 150 angstroms. A third conductive layer 114 is then deposited within the opening 106 as shown in FIG. 4. This conductive layer 114 may be formed from the same conductive material used to form either the second conductive layer 112 or the adhesion/barrier layer 110. A CMP process is then performed, leaving an electrode structure 250 as shown in FIG. 5. Because the third conductive layer 114 is formed from a single conductive material, the resulting electrode structure 250 presents a contact surface 116 having the desired uniform work function.

In accordance with a second exemplary embodiment of the present invention, an electrode structure and a method of forming an electrode structure is provided in which a patterned bottom electrode structure is formed such that it presents a contact surface having a uniform electrode work function.

Referring again to FIGS. 1A-1D, an electrode structure 100 in accordance with the second exemplary embodiment is formed by depositing a first conductive layer 102 and forming a dielectric layer 104 over the first conductive layer. An opening 106 is made in the dielectric to expose a portion of the surface of the first conductive layer 102. An adhesion/barrier layer 110 is deposited over the dielectric layer 104 followed by deposition of a second conductive layer 112 over the adhesion/barrier layer 110. The resulting structure is planarized and etched to form a structure as shown in FIG. 3. A third conductive layer 114 is deposited within the opening 106 as shown in FIG. 4. This conductive layer 114 may be formed from the same conductive material used to form either the second conductive layer 112 or the adhesion/barrier layer 110. The third conductive layer 114 is patterned using conventional photolithography techniques so as to form an electrode structure 300 having a conductive layer 114' with a desired shape as shown, for example, in FIG. 6.

In accordance with a third exemplary embodiment of the present invention, a resistance variable memory device and a method of forming a resistance variable memory device are provided.

Figure 6:
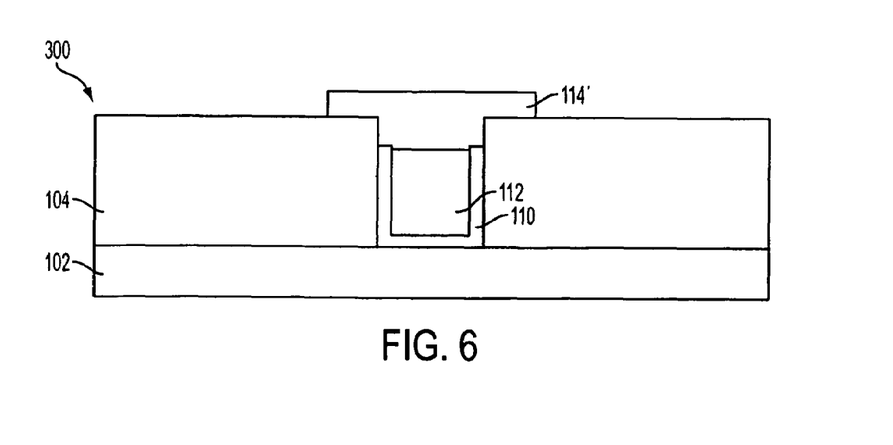
FIG. 6 shows an electrode structure in accordance with a second exemplary embodiment of the invention.
Figure 7:
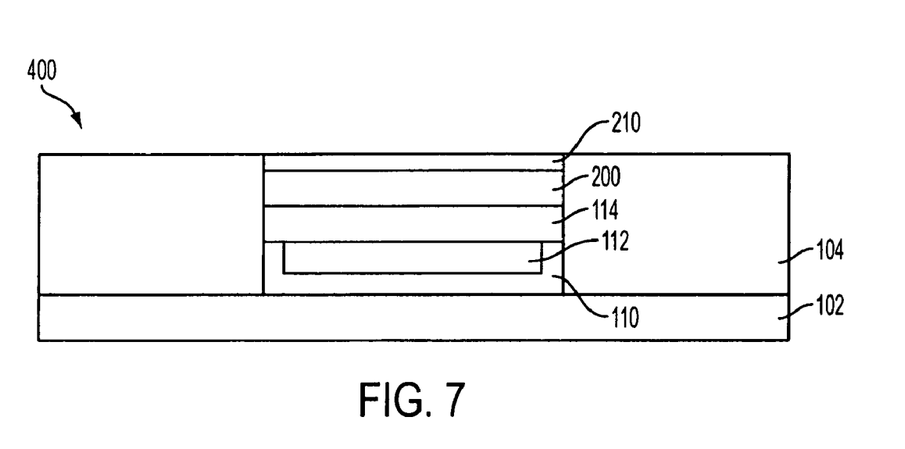
FIG. 7 shows a resistance variable memory device employing an electrode structure in accordance with the present invention.

As described above, the electrode structures 250, 300 of the first and second exemplary embodiments may be used in conjunction with a resistance variable memory element 200 in order to form a resistance variable memory device 400 as shown, for example, in FIG. 7. The resistance variable memory element 200 may be any suitable non-volatile or semi-volatile memory element such as the chalcogenide glass and molecular memory elements described above. The resistance variable memory device 400 is formed by depositing a resistance variable memory element 200 over the electrode structures 250 (FIG. 5), 300 (FIG. 6). A conductive layer 210 is deposited over the resistance variable memory element 200, forming a top electrode. This top electrode 210 may be any suitable conductive material, such as tungsten, nickel, tantalum, aluminum, platinum, conductive nitrides, and other conductive materials. While FIG. 7 illustrates a resistance variable memory device employing an electrode structure in accordance with the first exemplary embodiment described above, a similar resistance variable memory device may employ the electrode structure in accordance with the second exemplary embodiment.

Figure 8:
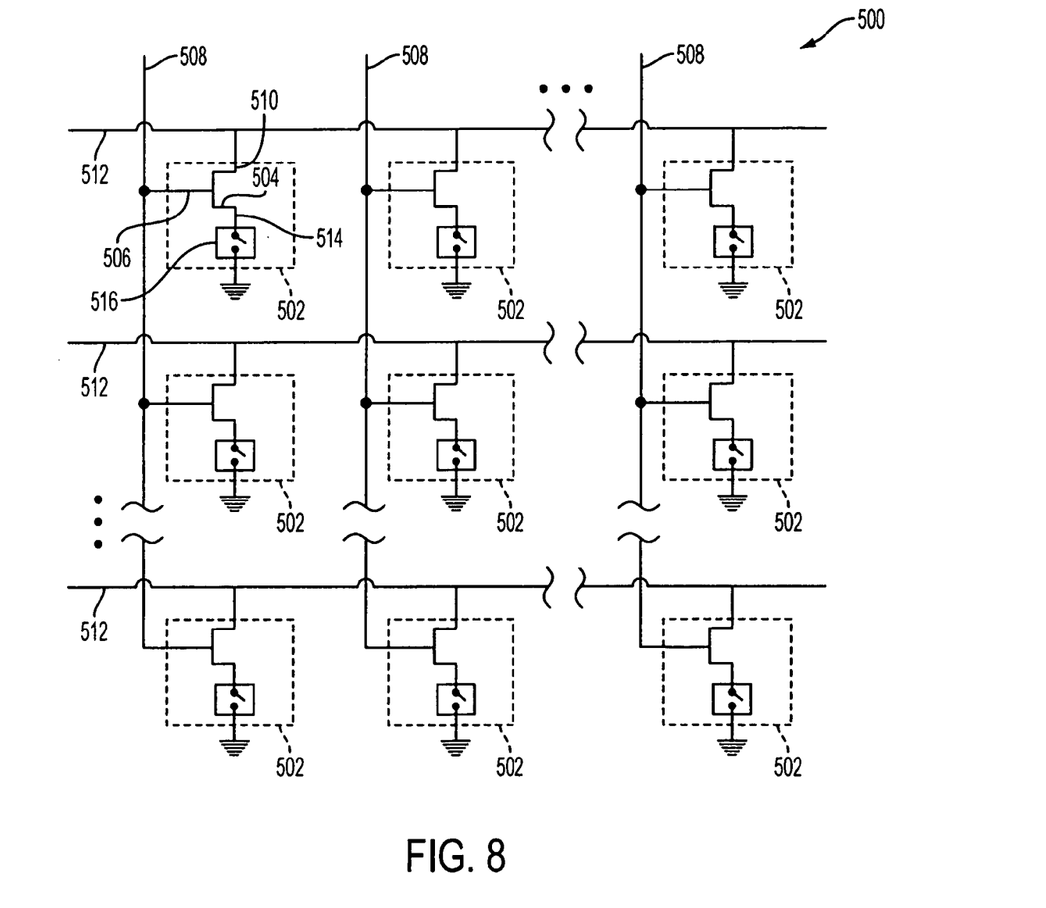
FIG. 8 shows a memory system employing memory devices having electrode structures in accordance with the present invention.

In accordance with a fourth exemplary embodiment of the present invention, a memory system 500 is provided, including a plurality of memory devices 502 utilizing electrodes with uniform work functions as shown in FIG. 8. Each memory device 502 can be arranged in rows and columns and can include a transistor 504. Each transistor 504 includes a gate electrode 506 coupled to an address line 508 for controlling the operation of the memory device 502. Each transistor 504 further includes a first source/drain electrode 510 coupled to a data line 512 and a second source/drain electrode 514 coupled to a programmable memory device 516 according to the teachings of the present invention, for example, the memory cell 400 shown in FIG. 7.

Figure 9:
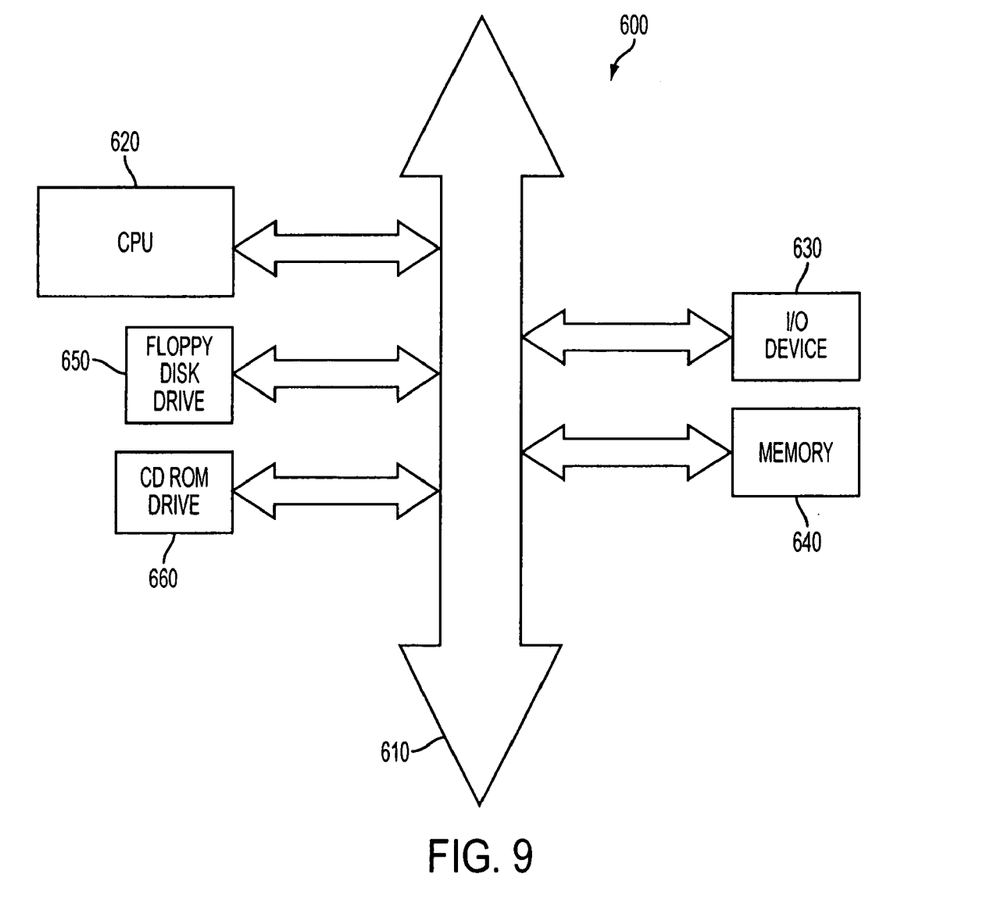
FIG. 9 shows a processor system employing memory devices having electrode structures in accordance with the present invention.

FIG. 9 illustrates a typical processor-based system 600 which includes a memory circuit 640, for example a PCRAM array, which employs resistance variable memory devices having electrodes with uniform work functions as described above. A processor system, such as a computer system, generally comprises a central processing unit (CPU) 620, such as a microprocessor, a digital signal processor, or other programmable digital logic devices, which communicates with an input/output (I/O) device 630 over a bus 610. The memory 640 communicates with the system over bus 610 typically through a memory controller.

In the case of a computer system, the processor system may include peripheral devices such as a floppy disk drive 650 and a compact disc (CD) ROM drive 660, which also communicate with CPU 620 over the bus 610. Memory 640 is preferably constructed as an integrated circuit, which includes one or more resistance variable memory devices 502 as shown in FIG. 8. If desired, the memory 640 may be combined with the processor, for example CPU 620, in a single integrated circuit.

The above description and drawings are only to be considered illustrative of exemplary embodiments, which achieve the features and advantages of the invention. Modification and substitutions to specific process conditions and structures can be made without departing from the spirit and scope of the invention. Accordingly, the invention is not to be considered as being limited by the foregoing description and drawings, but is only limited by the scope of the appended claims.

What is claimed as new and desired to be protected by Letters Patent of the United States is:

1. A method of forming an electrode, comprising:
   forming a dielectric layer over a first conductive layer, a bottom surface of the dielectric layer being between the first conductive layer and a top surface of the dielectric layer;
   forming an opening in said dielectric layer so as to expose a portion of said first conductive layer;
   forming an adhesion layer over said dielectric layer and said exposed portion of said first conductive layer;
   forming a second conductive layer over said adhesion layer;
   forming a third conductive layer only within said opening, said third conductive layer being arranged over, in direct physical contact with, and capping said second conductive layer and said adhesion layer within said opening, said third conductive layer being formed such that an electrode contact surface of the third conductive layer extends to the top surface of the dielectric layer and has an area equal to the size of the opening.

2. The method of claim 1, further comprising the step of recessing said second conductive layer and said adhesion layer within said opening.

3. The method of claim 1, wherein said step of forming a third conductive layer further comprises planarizing said third conductive layer such that the electrode contact surface of said third conductive layer is substantially level with said top surface of said dielectric layer.

4. The method of claim 1, wherein said adhesion layer is formed from on one of an oxide and a nitride.

5. The method of claim 4, wherein said adhesion layer is titanium nitride.

6. The method of claim 1, wherein said first conductive layer is formed from at least one of the group consisting of tungsten, nickel, tantalum, aluminum, platinum, and conductive nitrides.

7. The method of claim 1, wherein said second conductive layer is tungsten.

8. The method of claim 1, wherein said third conductive layer is formed from a same material as the first conductive layer.

9. The method of claim 1, wherein said third conductive layer is formed from a same material as the second conductive layer.

10. The method of claim 1, further comprising:
planarizing said third conductive layer down to said surface of said dielectric layer such that said electrode is patterned by said opening.

11. A method of forming a memory device, comprising:
forming a dielectric layer over a first conductive layer;
forming an opening in a surface of said dielectric layer so as to expose a portion of said first conductive layer;
forming an adhesion layer over said dielectric layer and said exposed portion of said first conductive layer;
forming a second conductive layer over said adhesion layer;
forming a third conductive layer only within said opening, said third conductive layer being arranged over and in contact with said second conductive layer and said adhesion layer within said opening; and
forming a variable resistance memory element within said opening, said memory element being arranged over and in contact with said third conductive layer.

12. The method of claim 11, further comprising the step of recessing said second conductive layer and said adhesion layer within said opening.

13. The method of claim 11, wherein said third conductive layer is patterned using photolithography and dry etching.

14. The method of claim 11, wherein said adhesion layer is formed from one of an oxide and a nitride.

15. The method of claim 11, wherein said adhesion layer is titanium nitride.

16. The method of claim 11, wherein said first conductive layer is formed from at least one of the group consisting of tungsten, nickel, tantalum, aluminum, platinum, and conductive nitrides.

17. The method of claim 11, wherein said second conductive layer is formed from tungsten.

18. The method of claim 11, wherein said third conductive layer is formed from the same material as the first conductive layer.

19. The method of claim 11, wherein said third conductive layer is formed from the same material as the second conductive layer.

20. The method of claim 11, further comprising:
forming another electrode within said opening, said another electrode being arranged over and in contact with said memory element; and
planarizing said another electrode down to said surface of said dielectric layer such that said another electrode is patterned by said opening.

21. The method of claim 11, wherein said third conductive layer is arranged over, in direct physical contact with, and encloses said second conductive layer and said adhesion layer within said opening.

22. A method of forming a memory device, comprising:
forming a dielectric layer over a first conductive layer;
forming a via in a surface of said dielectric layer so as to expose a portion of said first conductive layer;
forming an adhesion portion over said dielectric layer and said exposed portion of said first conductive layer;
forming a second conductive portion over said adhesion portion;
forming a third conductive portion, said third conductive portion being arranged over and in contact with said second conductive portion and said adhesion portion; and
forming a variable resistance memory element, said memory element being arranged over and in contact with said third conductive portion.

23. The method of claim 22, further comprising recessing said second conductive portion and said adhesion portion within said via.

24. The method of claim 22, further comprising recessing said variable resistance memory element within said via.

25. The method of claim 22, wherein said third conductive portion is patterned using photolithography and dry etching.

26. The method of claim 22, wherein said adhesion portion is titanium nitride.

27. The method of claim 22, wherein said third conductive portion is formed from the same material as the first conductive layer or the second conductive portion.

28. The method of claim 22, further comprising:
planarizing said third conductive portion down to a surface of said dielectric layer such that said electrode is patterned by said via.

29. The method of claim 22, further comprising:
forming another electrode within said via, said another electrode being arranged over and in contact with said memory element; and
planarizing said another electrode down to said surface of said dielectric layer such that said another electrode is patterned by said via.

30. A method of forming an electrode, comprising:
forming a dielectric layer over a first conductive layer, a bottom surface of the dielectric layer being between the first conductive layer and a top surface of the dielectric layer;
forming a via in said dielectric layer so as to expose a portion of said first conductive layer, said via consisting of two sidewalls and a base wall;
forming an adhesion portion over said dielectric layer and said exposed portion of said first conductive layer;
forming a second conductive portion over said adhesion portion;
forming a third conductive portion within said via, said third conductive portion being arranged over and in direct physical contact with said second conductive portion such that said second conductive portion and said adhesion portion are capped within said via, said third conductive portion being formed such that an electrode contact surface of the third conductive portion extends to the top surface of the dielectric layer and has an area equal to the size of the via.

31. The method of claim 30, wherein said formed second conductive portion and said formed adhesion portion are recessed within said via.

32. The method of claim 30, wherein the step of forming a third conductive portion comprises planarizing said third conductive portion such that the electrode contact surface of said third conductive portion is substantially level with said surface of said dielectric layer.

33. The method of claim 30, wherein said third conductive portion is formed from a same material as the first conductive layer.

34. The method of claim 30, wherein said third conductive portion is formed from a same material as the second conductive portion.

* * * * *

UNITED STATES PATENT AND TRADEMARK OFFICE
CERTIFICATE OF CORRECTION

PATENT NO. : 7,691,683 B2 Page 1 of 1
APPLICATION NO. : 11/368455
DATED : April 6, 2010
INVENTOR(S) : Joseph F. Brooks et al.

It is certified that error appears in the above-identified patent and that said Letters Patent is hereby corrected as shown below:

Col. 7, Claim 4, line 2, "formed from on one of an oxide and a nitride" should read -- formed from one of an oxide and a nitride --.

Signed and Sealed this

Twenty-second Day of June, 2010

David J. Kappos
*Director of the United States Patent and Trademark Office*

UNITED STATES PATENT AND TRADEMARK OFFICE
CERTIFICATE OF CORRECTION

PATENT NO. : 7,691,683 B2
APPLICATION NO. : 11/368455
DATED : April 6, 2010
INVENTOR(S) : Joseph F. Brooks et al.

It is certified that error appears in the above-identified patent and that said Letters Patent is hereby corrected as shown below:

Column 7, line 15 (Claim 4, line 2) "formed from on one of an oxide and a nitride" should read -- formed from one of an oxide and a nitride --.

Signed and Sealed this

Twentieth Day of July, 2010

David J. Kappos
*Director of the United States Patent and Trademark Office*